United States Patent
Huang et al.

(10) Patent No.: US 6,466,477 B1
(45) Date of Patent: Oct. 15, 2002

(54) METHOD OF STABILIZING REFERENCE BIT OF MULTI-BIT MEMORY CELL

(75) Inventors: Smile Huang, Tainan (TW); Ming-Hung Chou, Miaoli Hsien (TW); Chia-Hsing Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,913

(22) Filed: Nov. 13, 2001

(30) Foreign Application Priority Data

Nov. 5, 2001 (TW) ........................................ 90127397 A

(51) Int. Cl.[7] .............................................. G11C 19/08
(52) U.S. Cl. .................................. 365/185.03; 365/210
(58) Field of Search ........................... 365/185.03, 210, 365/185.11, 185.19, 185.21

(56) References Cited

U.S. PATENT DOCUMENTS

| | | | | |
|---|---|---|---|---|
| 5,091,888 A | * | 2/1992 | Akaogi | 365/210 |
| 5,615,153 A | * | 3/1997 | Yiu et al. | 365/185.19 |
| 6,160,737 A | * | 12/2000 | Hsu et al. | 365/185.24 |
| 6,188,604 B1 | * | 2/2001 | Liu et al. | 365/185.11 |
| 6,262,916 B1 | * | 7/2001 | Kuriyama et al. | 365/185.24 |

OTHER PUBLICATIONS

U.S. patent publication application US 2001/0048614 By Bloom et al.*

* cited by examiner

*Primary Examiner*—David Nelms
*Assistant Examiner*—Thinh Nguyen
(74) *Attorney, Agent, or Firm*—J.C. Patents

(57) ABSTRACT

A method of stabilizing a reference bit of a multi-bit memory cell. A first bit of a multi-bit memory cell is pre-programmed to high during fabrication. While reading the multi-bit memory cell, another bit other than the first bit is read as a reference bit.

2 Claims, 1 Drawing Sheet

METHOD OF STABILIZING REFERENCE BIT OF MULTI-BIT MEMORY CELL

CROSS-REFERENCE TO RELATED APPLICATION

This application claims the priority benefit of Taiwan application serial no. 90127397, filed Nov. 5, 2001.

BACKGROUND OF THE INVENTION

1. Field of the Invention

The invention relates in general to a method of stabilizing a reference bit, and more particularly, to a method of stabilizing a reference bit of a multi-bit memory cell.

2. Description of the Related Art

The NROM is a memory structure that can store two bits in one memory cell. One or more memory cells are used as reference cells for either the typical memory chip or the NROM array chip. The current obtained by reading the reference bit of the reference memory cell can be used as a comparison reference for reading other memory cells in the same memory. However, while reading the reference bit in the reference cell in the prior art, a few electrons may tunnel through the oxide layer and stay in the floating gate due to the channel hot electron effect. Thus, the current obtained by reading the reference cell is different from the required current.

FIG. 1 shows the structure of a conventional NROM memory.

Voltages are respectively applied to the gate 11 and the source/drain region (2) 16 to read the reference bit (bit1) of the floating gate 13. When the reference bit (bit1) is low, a channel is formed between the source/drain region (2) 16 and the source/drain region (1) 15. The current flows from the source/drain region (1) 15 to the source/drain region (2) 16. When the reference bit (bit1) is high, the high electric field around the source/drain region (2) 16 of the NROM 10 shuts the channel. There is no current flowing between the source/drain region (2) 16 and the source/drain region (1) 15. When there is a current flowing through the channel, the carrier in the channel is accelerated to cause a series of bombardments. After bombarding with the silicon lattice, an electron-hole pair is generated. The electron and hole are further accelerated by the electric field to cause another order of bombardment. The high-energy carriers thus have great opportunity to tunnel through the first oxide layer 14 and stay in the nitride layer 13. This is the process for programming the reference bit (bit1).

After reading the NROM10 several times, the electrons accumulate in the position where the reference bit (bit1) is located in the nitride layer 13. The current becomes unstable while reading the reference bit (bit1). It cannot be compared to the stored data in other memory cells correctly. The reference bit is thus meaningless.

SUMMARY OF THE INVENTION

The invention provides a method of stabilizing a reference bit of a multibit memory cell. The voltage of the reference bit of the multi-bit memory cell is effectively maintained in a stable state even after several reading processes. The current obtained by reading the reference bit is also stabilized.

In the method of stabilizing the reference bit of the multi-bit memory cell, a first bit is pre-programmed to high during fabrication. The rest of the bits excluding the first bit are then used as reference bits while reading the memory cell.

According to the above, the first bit of the reference memory cell is programmed to high, so that the threshold voltage of reference bit is stabilized. Consequently, the process of reading the reference bit is not affected by electron tunneling and the current is stable.

Both the foregoing general description and the following detailed description are exemplary and explanatory only and are not restrictive of the invention, as claimed.

DESCRIPTION OF THE PREFERRED EMBODIMENTS

In a typical memory cell that can only store one bit of data, a few electrons will tunnel through the oxide layer and stay in the floating gate due to the channel hot electron effect while reading the reference memory cell. The potential of the reference bit is thus changed. After several readings, the number of electrons accumulated in the floating increases to cause an unstable threshold voltage. While reading the reference cell, the current is consequently unstable. Generally speaking, the unstable threshold voltage of the reference bit occurs in the reading process.

Figure 1:
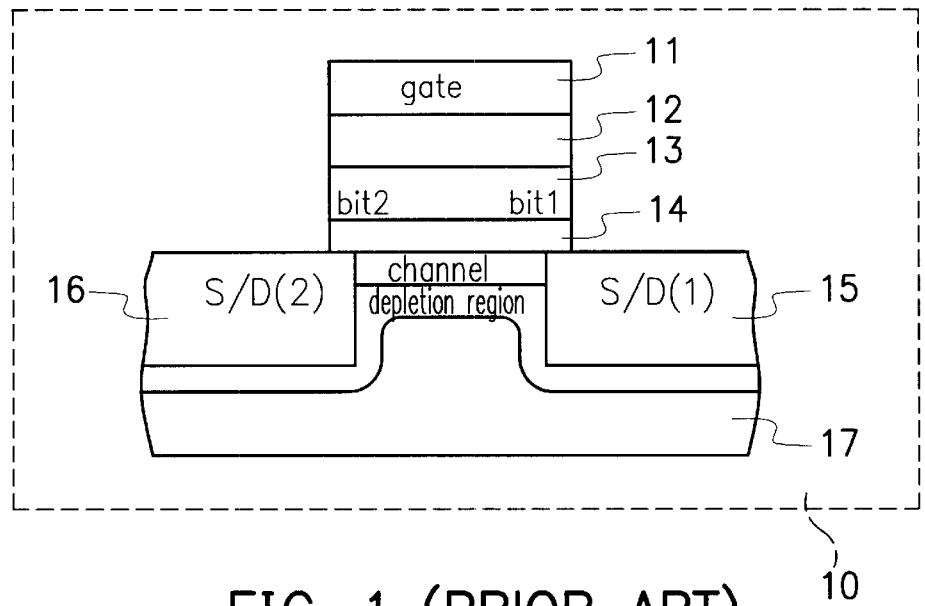
FIG. 1 shows the structure of a conventional NROM.
Figure 2:
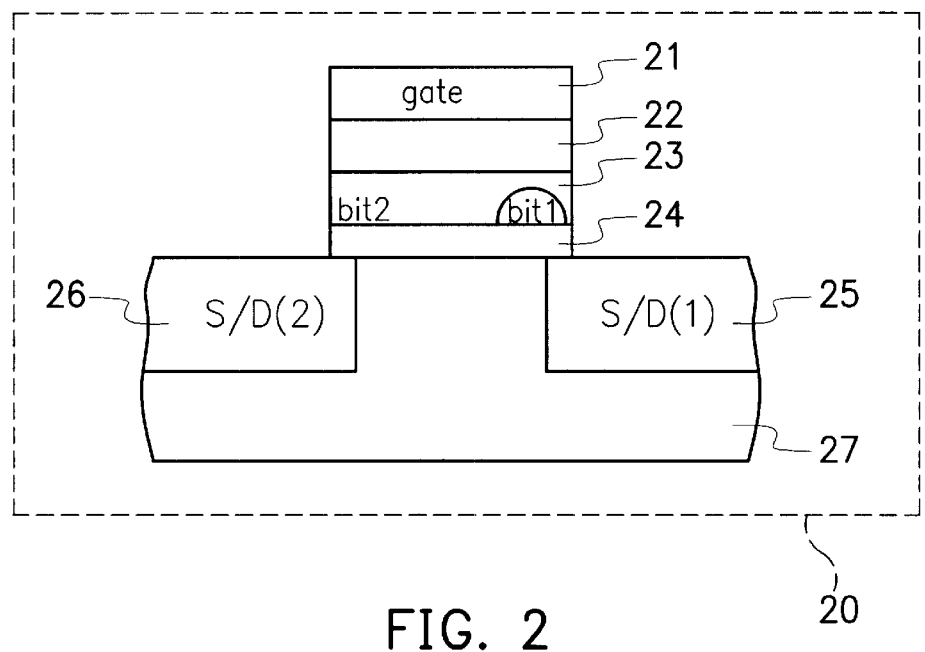
FIG. 2 shows the method of stabilizing the data stored in the reference memory cell.

In the multi-bit memory cell, as one memory cell can store more than one bits, the floating gate is made of non-metal material such as the nitride layer in the ONO (oxide/nitride/oxide) layer as shown in FIG. 1 or 2 for storing charges. The charges are trapped in the nitride layer without the any mobility. By trapping the charges in different areas of the nitride layer, a memory cell with multiple storage areas is formed. For example, the so-called NROM is formed with such structure. Therefore, one memory cell can store two bits of data.

The invention incorporates one NROM as the reference memory cell. Referring to FIG. 2, the bit bit1 in the nitride 23 of the multi-bit memory cell 20 is programmed to high. Since the bit bit1 is high, another bit bit2 is used as the reference bit. While reading the reference bit bit2, the high level of the bit bit1 causes the channel resistance under the bit bit1 to be higher than that under the bit bit2. The electron in the channel under the reference bit bit2 cannot tunnel through the oxide layer 24 to reach the nitride layer 23. Therefore, the reading process of the reference bit bit2 will not program the reference bit bit2. The bit bit2 thus has a stable threshold voltage. The current obtained by performing the reading operation on the bit bit2 is thus further stabilized.

The reading operation performed on the structure as shown in FIG. 2 is described as follows. While reading the second bit bit2 (that is, the reference bit) in the nitride layer 13 of the multi-bit memory cell 20, high voltages are applied to the first source/drain region 25 and the gate 21. When the reference bit bit2 is low, a channel is formed between the source/drain region (1) 25 and the source region (2) 26. The current flows from the source/drain region (1) 25 towards the source/drain region (2) 26. When the bit line bit1 is high, a high electric field around the source/drain region (1) 25 of the multi-bit memory cell 20 shuts the channel. There is thus no current flowing between the source/drain region (2) 26 and the source/drain region (1) 25.

Before the potential of the bit bit1 reaches a level high enough to shut the channel, the channel still conducts. Meanwhile, as the bit bit1 is under a high level, the channel resistance under the bit bit1 is higher than that under the bit bit2, the bias applied for reading falls on the channel under the bit bit1. Therefore, the channel under the reference bit bit2 cannot tunnel into the nitride layer 23 to cause the reference bit bit2 to be programmed. The reference bit bit2 thus has a stable threshold voltage.

It is appreciated that the above method of stabilizing the threshold voltage of the reference bit can be applied to the reference bit of other kinds of multi-bit memory cells.

According to the above, the invention has the following advantages. In the invention, a first bit of a reference memory cell of a multi-bit memory cell is pre-programmed to high, such that the second bit functioning as the reference bit can have a stable threshold voltage. After reading the reference bit several times, the reading current is kept stable without losing the meaning of setting up the reference bit.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of stabilizing a reference bit of a multi-bit memory cell, comprising:
   pre-programming a first bit of the multi-bit memory cell to high while fabricating the multi-bit memory cell; and
   using another bit of the multi-bit memory cell as the reference bit while reading the multi-bit memory cell.

2. The method according to claim 1, wherein multi-bit memory cell includes a NROM.

* * * * *